(12) United States Patent
Moon et al.

(10) Patent No.: US 8,399,760 B2
(45) Date of Patent: Mar. 19, 2013

(54) SOLAR CELL HAVING IMPROVED ELECTRODE STRUCTURE REDUCING SHADING LOSS

(75) Inventors: In-Sik Moon, Suwon-si (KR); Dae-Won Kim, Suwon-si (KR)

(73) Assignee: Samsung SDI Co., Ltd., Yongin-si (KR)

(*) Notice: Subject to any disclaimer, the term of this patent is extended or adjusted under 35 U.S.C. 154(b) by 381 days.

(21) Appl. No.: 12/121,894

(22) Filed: May 16, 2008

(65) Prior Publication Data

US 2009/0178707 A1 Jul. 16, 2009

(30) Foreign Application Priority Data

Jan. 11, 2008 (KR) .................. 10-2008-0003532

(51) Int. Cl.
*H01L 31/00* (2006.01)
(52) U.S. Cl. ........................ 136/256; 136/252
(58) Field of Classification Search ............... 136/244, 136/252, 255, 256, 258; 438/57; 427/74; 257/774
See application file for complete search history.

(56) References Cited

U.S. PATENT DOCUMENTS

| | | | |
|---|---|---|---|
| 5,057,439 A | 10/1991 | Swanson et al. | |
| 5,164,019 A | 11/1992 | Sinton | |
| 5,320,684 A | 6/1994 | Amick et al. | |
| 6,143,976 A | 11/2000 | Endros | |
| 6,384,317 B1 * | 5/2002 | Kerschaver et al. | 136/256 |
| 7,144,751 B2 | 12/2006 | Gee et al. | |
| 2006/0060238 A1 | 3/2006 | Hacke et al. | |
| 2008/0174028 A1 * | 7/2008 | Korevaar et al. | 257/774 |

FOREIGN PATENT DOCUMENTS

| | | |
|---|---|---|
| CN | 1244949 A | 2/2000 |
| JP | 64-082570 | 3/1989 |
| JP | 01-281776 | 11/1989 |
| JP | 9-266321 | 10/1997 |
| JP | 11-261092 | 9/1999 |
| JP | 2001-504996 | 4/2001 |
| JP | 2003-338631 | 11/2003 |
| JP | 2004-031740 | 1/2004 |
| JP | 2006-324504 | 11/2006 |

(Continued)

OTHER PUBLICATIONS

English machine translation of Ikushima et al., JP2006-324504 (Nov. 2006).*

(Continued)

*Primary Examiner* — Jonathan Johnson
*Assistant Examiner* — Lindsey Bernier
(74) *Attorney, Agent, or Firm* — Christie, Parker & Hale, LLP

(57) ABSTRACT

A solar cell having an improved electrode structure includes a semiconductor substrate having a via hole, an emitter portion, a base, a first electrode, and a second electrode. The semiconductor substrate includes a first surface and a second surface opposite to each other. The emitter portion is formed adjacent to the first surface of the semiconductor substrate and extends to the second surface of the semiconductor substrate through a portion adjacent to the via hole. The first electrode includes a first electrode portion formed on the first surface of the semiconductor substrate. The first electrode portion includes a first portion having a first width and a second portion having a second width larger than the first width, and the second portion corresponds to the via hole.

13 Claims, 3 Drawing Sheets

FOREIGN PATENT DOCUMENTS

| | | |
|---|---|---|
| JP | 2007-527622 | 9/2007 |
| JP | 2007-311425 | 11/2007 |
| JP | 2008-034609 | 2/2008 |
| JP | 2008-227269 | 9/2008 |

OTHER PUBLICATIONS

English human translation of Kim et al. "Development of manufacturing processes of crystalline silicon back contact solar cells".*

English human translation of Kim et. al. "Development of manufacturing processes of crystalline silicon back contact solar cells". The Korean society for new and renewable energy: Journal of conference. 2005. pp. 89-93.*

Daewon Kim et al., "Development of Manufacturing Processes of Crystalline Silicon Back Contact Solar Cells," Jun. 2005, pp. 89-93.

Korean Office Action dated Sep. 28, 2009, issued in corresponding Korean Patent Application No. 10-2008-0003532.

Notice of Decision to Grant a Patent dated Mar. 23, 2010, issued in corresponding Korean Patent Application No. 10-2008-0003532.

Japanese Office action dated Oct. 19, 2010, for corresponding Japanese Patent application 2008-085491, noting listed references in this IDS.

Patent Abstracts of Japan and English machine translation of Japanese Publication 2008-034609 listed above.

SIPO Office action dated Dec. 25, 2009, for Chinese Patent application 200810214324.X, with English translation.

Hilali, M., et al., *Effect of Ag Particle Size in Thick-Film Ag Paste on Electrical and Physical Properties of Screen Printed Contacts and Silicon Solar Cells*, Journal of the Electrochemical Society, vol. 153, No. 1, (2006) pp. A5-A11.

Hilali, M., et al., *A Review and Understanding of Screen-Printed Contacts and Selective-Emitter Formation*, National Renewable Energy Laboratory (NREL), 14th Workshop on Crystalline Silicon Solar Cells and Modules, Winter Park, CO, Aug. 8-11, 2004, 11 pages.

Feng, Y, et al., *High resolution electron microscopy study of nickel silicide—silicon interface grown by molecular beam epitaxy*, Journal of Materials Science Letters, 1996, vol. 15, pp. 2000-2001.

Japanese Notice of Allowance dated May 22, 2012, for Japanese Patent application 2008-085491, (1 page).

Patent Abstracts of Japan, and English machine translation of Japanese Publication 2007-311425 listed above, (13 pages).

Patent Abstracts of Japan, and English machine translation of Japanese Publication 2008-227269 listed above, (17 pages).

U.S. Notice of Allowance dated Aug. 17, 2012, for cross reference U.S. Appl. No. 12/122,166 (13 pages).

* cited by examiner

SOLAR CELL HAVING IMPROVED ELECTRODE STRUCTURE REDUCING SHADING LOSS

CROSS-REFERENCE TO RELATED APPLICATIONS

This application claims the benefit of Korean Patent Application No. 10-2008-0003532 filed in the Korean Intellectual Property Office on Jan. 11, 2008, the contents of which are incorporated herein by reference.

BACKGROUND OF THE INVENTION

1. Field of the Invention

An aspect of the present invention relates to a solar cell, and more particularly, to a solar cell having an improved electrode structure.

2. Description of the Related Art

A solar cell generates electrical energy from solar energy. The solar cell is environmentally friendly, and its energy source is endless. In addition, the solar cell has a long lifespan. Examples of the solar cell include a semiconductor solar cell and a dye-sensitized solar cell according to a scheme of how electrical energy is generated from solar energy.

In the semiconductor solar cell, a base and an emitter portion are formed in a semiconductor substrate, which have different types of conductivities, to form a p-n junction. A first electrode is electrically connected to the emitter portion, and a second electrode is electrically connected to the base.

Generally, the first electrode is formed on a front surface of the semiconductor substrate, and the second electrode is formed on a rear surface of the semiconductor substrate. However, if the first electrode is formed in a large area of the semiconductor substrate, in order to reduce resistance, the first electrode blocks the incident light on the front surface of the semiconductor substrate, thus increasing shading due to the increased size of the first electrode.

In order to reduce the shading, a solar cell in which the first electrode including a front portion formed on the front surface of the semiconductor substrate and a rear portion formed on the rear surface of the semiconductor substrate, and connected to the front portion through a via hole has been suggested.

In the above-structured solar cell, to reduce the shading, the width of the front portion of the first electrode should be small. However, if the width of the front surface is smaller than a predetermined width, a misalignment may arise by a process error in the forming of the front portion. If the misalignment exists, the area of the front portion contacting the via hole decreases, and the resistance increases and energy conversion efficiency is reduced. If the process error is extremely large, the front portion may not connect at all to the via hole, and thus the solar cell cannot work.

The above information disclosed in this Background section is only for enhancement of understanding of the background of the invention and therefore it may contain information that does not form the prior art that is already known in this country to a person of ordinary skill in the art.

SUMMARY OF THE INVENTION

An aspect of the present invention has been made in an effort to provide a solar cell having advantages of reducing shading loss, preventing a misalignment, and increasing energy conversion efficiency.

An exemplary embodiment of the present invention provides a semiconductor substrate having a via hole, an emitter portion, a base, a first electrode, and a second electrode. The semiconductor substrate includes a first surface and a second surface opposite to each other. The emitter portion is formed adjacent to the first surface of the semiconductor substrate and extends to the second surface of the semiconductor substrate at a portion adjacent to the via hole. The base forms a p-n junction in the semiconductor substrate along with the emitter portion. The first electrode is electrically connected to the emitter portion. The second electrode is electrically connected to the base. The first electrode at least includes a first electrode portion formed on the first surface. The first electrode portion includes a first portion having a first width and a second portion having a second width larger than the first width, and the second portion is formed to correspond to the via hole.

According to another aspect of the present invention, the second width may be larger than a diameter of the via hole. A ratio of the diameter of the via hole to the second width may be within a range of 15:16 to 1:4.

According to another aspect of the present invention, a length of the first electrode portion measured in a longitudinal direction of the first electrode may be larger than a diameter of the via hole. A ratio of the diameter of the via hole to the length of the second portion may be within a range of 15:16 to 1:4.

According to another aspect of the present invention, the first width may be smaller than or the same as a diameter of the via hole.

According to another aspect of the present invention, the first portion may have a line shape.

According to another aspect of the present invention, the second portion may extend from both sides of the first portion.

According to another aspect of the present invention, the second portion has a polygon shape or a round shape.

According to another aspect of the present invention, the first surface of the semiconductor is a front surface where light is incident therethrough.

According to another aspect of the present invention, the first electrode may further include a second electrode portion formed on the second surface of the semiconductor substrate and connected to the first electrode portion through the via hole. The second electrode portion may have a larger width than the first width.

According to another aspect of the present invention, when viewed in a plan view, the first electrode portion may extend along a first direction, and the second electrode portion may extend along a second direction crossing the first direction. The second electrode may be spaced apart from the second electrode portion on the second surface of the semiconductor substrate.

According to the present exemplary embodiment, the first electrode portion of the first electrode formed on the first surface of the semiconductor substrate includes a first portion and a second portion having different widths, thereby improving energy conversion efficiency. That is, the shading can be reduced by decreasing the first width of the first portion formed at a portion where the via hole is not formed. The misalignment of the first electrode portion and the via hole can be prevented by increasing the width and the length of the second portion corresponding to the via hole, even if a process error exists. By reducing the shading and preventing the misalignment, energy conversion efficiency can be improved.

According to another aspect of the present invention, the width and the length of the second portion are determined taking into consideration the process error, thereby maximizing the effect of preventing the misalignment. Since the first portion has a line shape having a smaller width than or the same as the diameter of the via hole, the shading loss can be maximized.

According to another aspect of the present invention, because the second portion protrudes from both sides of the first portion, an upward and downward (in the drawings) process error can be properly managed.

According to another aspect of the present invention, the second electrode portion formed on the rear surface of the semiconductor substrate has a larger width than the first portion. Thus, the power consumption can be reduced by decreasing the resistance of the electrode.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Hereinafter, an embodiment of a solar cell and a manufacturing method thereof will be described with reference to the accompanying drawings. The described embodiments may be modified in various different ways, all without departing from the spirit or scope of the present invention. The drawings and description are to be regarded as illustrative in nature and not restrictive.

Throughout this specification and the claims that follow, when it is described that an element is "formed on" another element, the element may be directly formed on the other element or formed on the other element with one or more elements disposed therebetween. In addition, unless explicitly described to the contrary, the word "comprise" and variations such as "comprises" or "comprising" will be understood to imply the inclusion of stated elements but not the exclusion of any other elements.

Figure 1:
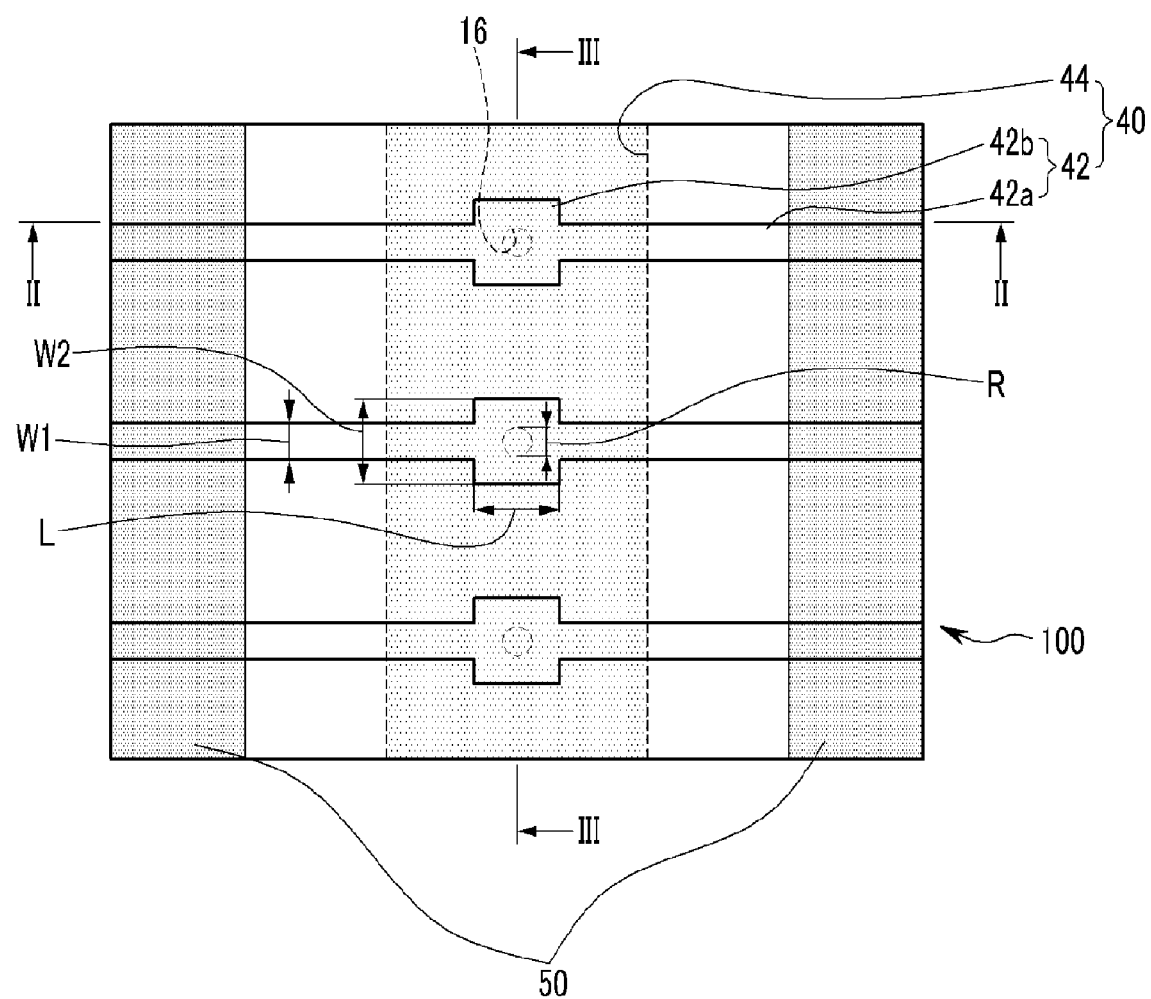
FIG. 1 is a schematic top plan view of a solar cell according to an exemplary embodiment of the present invention.
Figure 2:
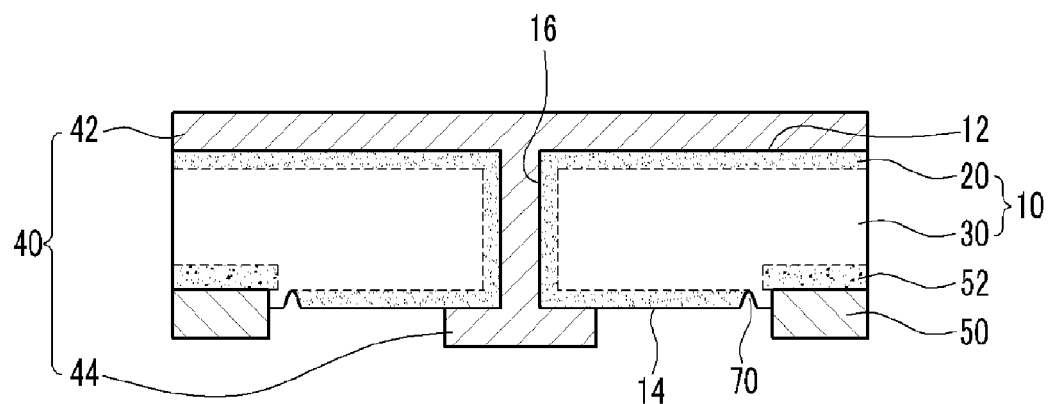
FIG. 2 is a cross-sectional view taken along a line II-II shown in FIG. 1.

FIG. 1 is a schematic top plan view of a solar cell according to an exemplary embodiment of the present invention. FIG. 2 is a cross-sectional view taken along a line II-II shown in FIG. 1, and FIG. 3 is a cross-sectional view taken along a line III-Ill shown in FIG. 1.

Figure 3:
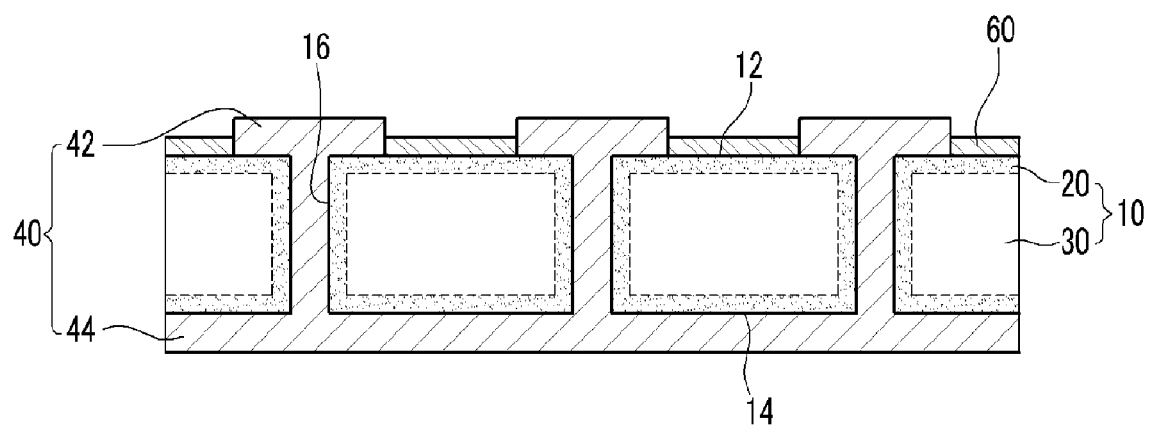
FIG. 3 is a cross-sectional view taken along a line III-III shown in FIG. 1.

Referring to FIGS. 1 to 3, a solar cell 100 according to the present exemplary embodiment includes a semiconductor substrate 10 having an emitter portion 20 and a base 30. The emitter portion 20 and the base 30 have different types of conductivity, and form a p-n junction. The solar cell 100 also includes at least one first electrode 40 electrically connected to the emitter portion 20, and at least one second electrode 50 electrically connected to the base 30. Hereinafter, the solar cell 100 will be described in more detail.

The emitter portion 20 is formed adjacent to a first surface (hereinafter, "front surface") 12 of the semiconductor substrate 10, and extends to a second surface (hereinafter, "rear surface") 14 of the semiconductor substrate 10 at a portion adjacent to a via hole 16. The first surface of the semiconductor is a front surface where light is incident.

The emitter portion 20 is formed of n-type crystalline silicon. However, the present invention is not limited thereto. Thus, the emitter portion 20 may be of a p-type, and may be formed of various materials.

The base 30 is a portion where the emitter portion 20 is not formed in the semiconductor substrate 10, and is formed of p-type crystalline silicon to from a p-n junction, along with the emitter portion 20. However, the present invention is not limited thereto. Thus, when the emitter portion 20 may be of a p-conductive type semiconductor, the substrate 10 is of an n-type conductive type. In addition, the base 30 may be formed of various materials.

In the present exemplary embodiment, the n-type emitter portion 20 may be formed by doping a dopant such as phosphor (P), arsenic (As), or antimony (Sb) on the p-type semiconductor substrate 10 having the via hole 16. However, the present invention is not limited thereto. Thus, the emitter portion can be formed by various methods.

An anti-reflective layer 60 is formed on a portion of the emitter portion 20 formed adjacent to the front surface 12 of the semiconductor substrate 10. Referring to FIG. 3, the anti-reflective layer 60 is formed at a portion where a first electrode portion 42 of the first electrode 40, which will be described later, is not positioned.

The anti-reflective layer 60 prevents a loss of light induced by reflection at the front surface 12 of the semiconductor substrate 10. In addition, the anti-reflective layer 60 of the present exemplary embodiment prevents charges from recombining with defects, such as dangling bonds, located on the front surface 12 of the semiconductor substrate 10.

In the present exemplary embodiment, the anti-reflective layer 60 may be formed of silicon nitride ($SiN_x$). However, the present invention is not limited thereto. The anti-reflective layer may be formed of various materials, such as a transparent conductive material, by various methods.

The first electrode 40 that is electrically connected to the emitter portion 20 is formed on both, the front surface 12 and the rear surface 14 of the semiconductor substrate 10. In more detail, the first electrode 40 includes a first electrode portion 42 formed on the front surface 12 of the semiconductor substrate 10, and a second electrode portion 44 formed on the rear surface 14 of the semiconductor substrate 10 and connected to the first electrode portion 42 through the via hole 16.

Referring to FIG. 1, when viewed in a plan view, the first electrode portion 42 extends along a first direction, and the second electrode portion 44 extends along a second direction crossing the first direction. By the above structure, the first electrode portion 42 and the second electrode portion 44 are connected to each other through the via hole 16. However, the present invention is not limited to this electrode structure.

The first electrode portion 42 of the present exemplary embodiment includes a first portion 42a collecting charges generated at the emitter portion 20, and a second portion 42b connected to the via hole 16, also collecting charges.

In the present exemplary embodiment, the first portion 42a has a first width W1, and the second portion 42b has a second width W2 that is larger than the first width W1. In the drawings, the first portion 42a has a uniform width W1 over the entire first portion 42a. However, the present invention is not limited thereto. Therefore, the first portion 42a and the second portion 42b include a portion where the width changes.

In the present exemplary embodiment, shading loss can be reduced by decreasing the first width W1 of the first portion 42a, and misalignment of the first electrode portion 42 and the via hole 16 can be suppressed by increasing the second width W2 of the second portion 42b. The reason why the second portion 42b prevents the misalignment is as follows.

As an example, the first electrode portion 42 may be formed by applying a paste including silver for forming the first electrode portion 42 on the anti-reflective layer 60 and performing a heat treatment. In the heat treatment process, the paste for forming the first electrode portion 42 etches the anti-reflective layer 60 by a firing through process, and thus the first electrode portion 42 is electrically connected to the emitter portion 20. If a process error exists when applying the paste for forming the first electrode portion, the first electrode portion is deviated from an original position in the conventional art. However, in the present exemplary embodiment, since the second portion 42b has a wide width, the whole via hole 16 is located inside the second portion 42b, even though the first electrode portion 42 is deviated from the original position. Accordingly, the misalignment of the first electrode portion 42 and the via hole 16 can be prevented.

In the present exemplary embodiment, the first portion 42a has a line shape. A plurality of first portions 42a are spaced apart from each other on the front surface 12 of the semiconductor substrate 10 in the present exemplary embodiment. Thus, electrons generated at the emitter portion 20 can be uniformly collected by the first electrode portion 42, while shading loss can be reduced.

Since the second portion 42b corresponding to the via hole 16 has a width that is different from that of the first portion 42a, the width of the first portion 42a can be further reduced. That is, in order to have a stable interconnection, the entire electrode portion formed on the front surface of the semiconductor substrate should have a width larger than a diameter of the via hole in the conventional art. However, this restriction does not apply to the present exemplary embodiment. Accordingly, the first width W1 of the first portion 42a may be smaller than or the same as the diameter R of the via hole 16. As a result, shading loss can be further reduced.

The second portion 42b protrudes from both sides of the first portion 42a. Thus, although the process error exists in either direction of upward or downward (in the drawings), the misalignment of the first electrode portion 42 and the via hole 16 can be prevented.

Figure 4:
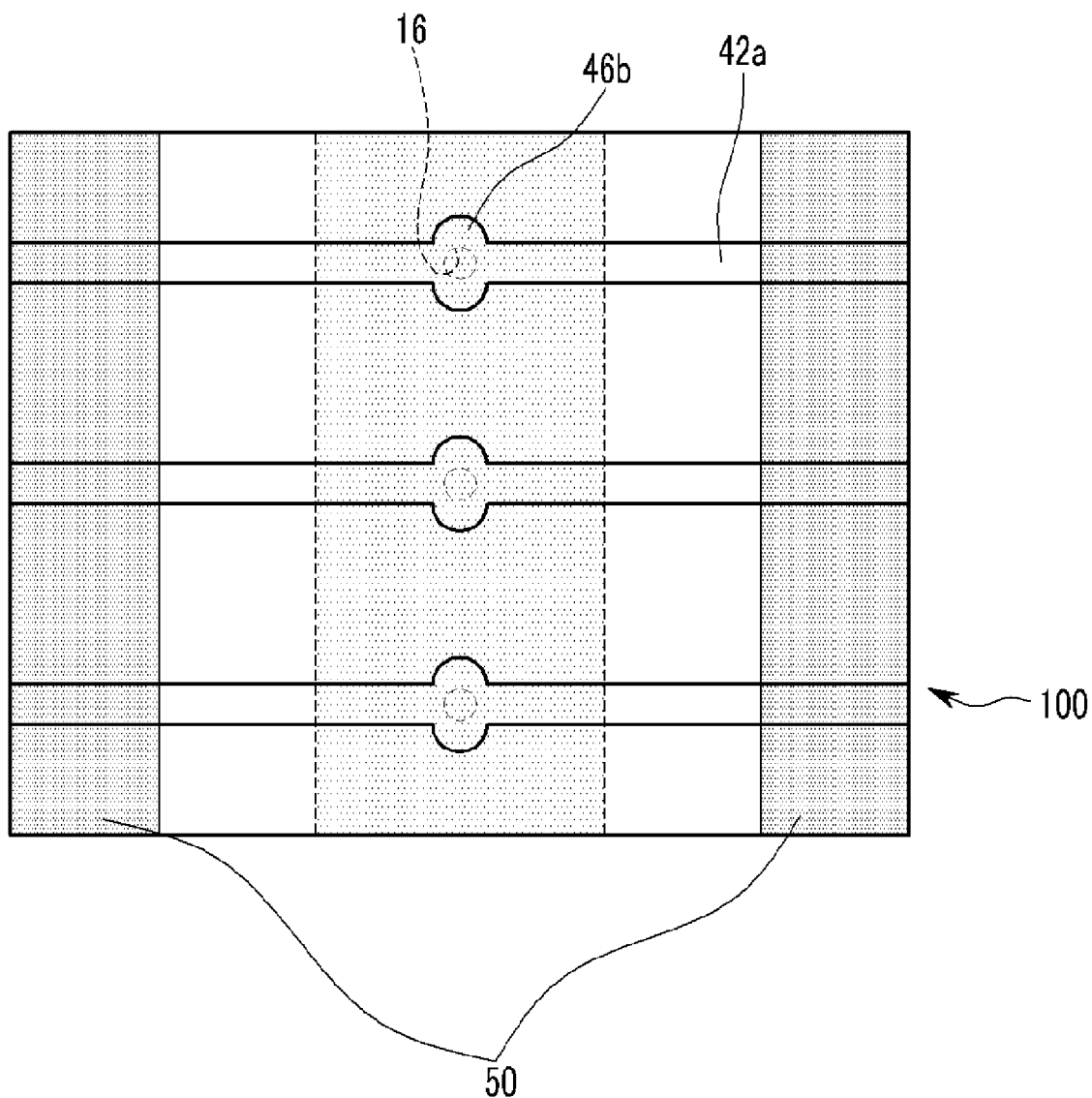
FIG. 4 is a schematic top plan view of a solar cell according to another exemplary embodiment of the present invention.

As an example, the second portion 42b has a polygon shape such as a quadrangle shape (see FIG. 1) and a hexagonal shape. As another exemplary embodiment, the second portion 42b may have a round shape corresponding to the via hole 16, as shown in FIG. 4.

The width W2 and length L of the second portion 42b are determined to prevent misalignment. Here, the length L of the second portion 42b is measured in a longitudinal direction of the first electrode portion 42.

The second portion 42b should have the width W2 and the length L that are larger than the diameter R of the via hole 16 so that the first electrode portion 42 can be connected to the entire via hole 16. The width W2 and the length L of the second portion 42b may be larger than a sum of the diameter R of the via hole 16 and twice the maximum process error, respectively.

For example, a ratio of the diameter R of the via hole 16 to the second width W2 of the second portion 42b is within a range of 15:16 to 1:4. These values are determined by considering that the diameter of the via hole 16 is within a range of about 50 to 150 µm and the maximum process error of the apparatus for forming electrodes is within a range about 5 to 75 µm. That is, the lowest limit corresponds to the ratio when the diameter R of the via hole 16 is 150 µm and the maximum process error is 5 µm. In this case, the width W2 and length L of the second portion 42b should be 160 µm considering the errors in the upward, downward, leftward, and rightward directions. Thus, the ratio is 15:16. The upper limit corresponds to the ratio when the diameter R of the via hole 16 is 50 µm and the maximum process error is 75 µm. In this case, the width W2 and length L of the second portion 42b should be 200 µm considering the errors in the upward, downward, leftward, and rightward directions. Thus, the ratio is 1:4.

In order to effectively prevent misalignment related to the process error and shading loss, the ratio may be within a range of 5:6 to 1:2. In more detail, when the ratio is larger than 5:6, the width W2 and the length L of the second portion 42b can be formed with an area that is suitable for preventing the misalignment, thus preventing the misalignment related to the process error. Also, when the ratio is less than 1:2, the width W2 and the length L of the second portion 42b are properly limited, thus reducing the shading loss.

However, because the maximum process error can vary according to the apparatus forming the first electrode portion 42, the ratio can have various values. In addition, as technology develops, the diameter R of the via hole 16 and the maximum process error of the apparatus can be changed. Therefore, the ratio is changed. That is, the aspects of the present invention are not limited to the range of the ratio.

The second electrode portion 44 formed on the rear surface 14 of the semiconductor substrate 10 does not block the incident light. Thus, the second electrode portion 44 has a larger width than the first portion 42a. Accordingly, the power consumption can be reduced by the reduced resistance of the electrode.

The second electrode portion 44 can be formed by applying the paste for forming the second electrode portion 44 to the inside of the via hole 16 and on the rear surface 14 of the semiconductor substrate 10 and sintering the same. The second electrode may be formed using a similar process as the one used for forming the first electrode portion 42. Therefore, firing is performed at a low temperature where the firing through is not induced.

The second electrode 50 that is electrically connected to the base 30 is formed to be spaced apart from the second electrode portion 44 formed on the rear surface 14 of the semiconductor substrate 10. The second electrode portion 44 is insulated from the second electrode 50 by an insulating portion 70 on the rear surface 14 of the semiconductor substrate 10.

The second electrode 50 may be formed by applying the paste including aluminum for forming the second electrode 50 and firing the same. In the firing process, aluminum in the paste for the second electrode is diffused into the rear surface 14 of the semiconductor substrate 10 to a predetermined depth. Then, in the portion where the aluminum is diffused, the n-type emitter portion 20 disappears and a rear electric field layer 52 of a high-concentrated p-type is formed. The rear electric field layer 52 prevents photo-excited electrons from being lost at the rear surface 14 of the semiconductor substrate 10.

When light is incident to the solar cell 100, a pair of a positive hole and an electron formed by a photoelectric effect is separated, and thus electrons are accumulated on the n-type emitter portion 20, whereas positive holes are accumulated on the p-type base 30. The charges are collected by the front and rear electrodes 40 and 50 and flow, and thus the solar cell works.

Hereinafter, an aspect of the present invention will be described in more detail referring to an experimental example. The experimental example is provided only for describing an aspect of the present invention more fully, thus the present invention is not limited thereto.

EXPERIMENTAL EXAMPLE

A p-type silicon semiconductor substrate having a thickness of 240 μm and including a via hole having a diameter of 100 μm was prepared. Phosphoryl chloride ($POCl_3$) was thermally pyrolyzed in a diffusion furnace, a phosphosilicate glass (PSG) layer having a thickness of 0.5 μm was thereby formed on the surface of the semiconductor substrate, and phosphor in the PSG layer was diffused into the semiconductor substrate such that an emitter portion was formed. The PSG was eliminated by diluted hydrofluoric acid (HF), and the unwanted portion among the portion where the phosphor was diffused was removed by a potassium hydroxide (KOH) solution.

An anti-reflective layer consisting of silicon nitride and having a thickness of 75 nm was formed on a front surface of the semiconductor substrate by plasma enhanced chemical vapor deposition.

A paste including aluminum for forming a second electrode was applied on the rear surface of the semiconductor substrate by screen printing, and a paste including silver for forming a first electrode portion was applied on the anti-reflective layer by a screen printing. Subsequently, a second electrode and a first electrode portion were formed with a firing through process by performing the heat treatment. In this process, a rear electric field is formed at a portion adjacent to the second electrode.

In the first electrode portion, a second portion corresponding to the via hole was quadrangle having a width of 300 μm and a length of 300 μm. A first portion of the first electrode portion not corresponding the via hole is a line having a width of 100 μm.

A second electrode portion was formed by applying a paste including silver for forming the second electrode portion on the rear surface of the semiconductor substrate by screen printing and performing the heat treatment at a temperature where the firing through is not generated. The insulating portion was formed on the rear surface of the semiconductor substrate by a laser.

Comparative Example

The solar cell was manufactured by the same method as in the experimental example, except that the first electrode portion includes a line having a width of 100 μm and that did not have a portion corresponding to the second portion of the experimental example.

The current density (Jsc), open circuit voltage (Voc), fill factor (FF), and energy conversion efficiency (Eff) of the solar cells according to the experimental example and the comparative example are shown in Table 1.

TABLE 1

| | Jsc [mA/cm$^2$] | Voc [mV] | FF [%] | Eff [%] |
|---|---|---|---|---|
| Experimental Example | 34.8 | 610 | 76.3 | 16.2 |
| Comparative Example | 34.5 | 609 | 75 | 15.8 |

The solar cell according to the experimental example had a larger current density (Jsc), open circuit voltage (Voc), fill factor (FF), and energy conversion efficiency than the solar cell according to the comparative example. That is, in the solar cell according to the experimental example, the energy conversion efficiency could be enhanced by improving the structure of the first electrode portion formed on the front surface of the semiconductor substrate.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A solar cell, comprising:
   a semiconductor substrate including a via hole, the semiconductor substrate having a first surface and a second surface opposite to each other;
   an emitter portion formed adjacent to the first surface of the semiconductor substrate and extending to the second surface of the semiconductor substrate at a portion adjacent to the via hole;
   a base forming a p-n junction in the semiconductor substrate along with the emitter portion;
   a first electrode electrically connected to the emitter portion; and a second electrode electrically connected to the base,
   wherein the first electrode comprises at least a first electrode portion formed on the first surface of the semiconductor substrate, and
   the first electrode portion comprises:
      a first portion having a first width; and
      a second portion having a second width that is larger than the first width,
   wherein the first portion is formed at opposite sides of the second portion, extends in a plane that is substantially parallel to the surfaces from the opposite sides of the second portion, and terminates at opposite edges of the first surface, and
   wherein the second portion is formed to correspond to the via hole.

2. The solar cell of claim 1, wherein the second width is larger than a diameter of the via hole.

3. The solar cell of claim 2, wherein a ratio of the diameter of the via hole to the second width is within a range of 15:16 to 1:4.

4. The solar cell of claim 1, wherein a length of the first electrode portion measured in a longitudinal direction of the first electrode is larger than a diameter of the via hole.

5. The solar cell of claim 4, wherein a ratio of the diameter of the via hole to a length of the second portion is within a range of 15:16 to 1:4.

6. The solar cell of claim 1, wherein the first width is smaller than or the same as a diameter of the via hole.

7. The solar cell of claim 1, wherein the first portion has a line shape.

8. The solar cell of claim 1, wherein the second portion extends from both sides of the first portion.

9. The solar cell of claim 1, wherein the second portion has a polygon shape or a round shape.

10. The solar cell of claim 1, wherein the first surface of the semiconductor is a front surface where light is incident therethrough.

11. The solar cell of claim 1, wherein the first electrode further comprises a second electrode portion formed on the second surface of the semiconductor substrate and connected to the first electrode portion through the via hole, and the second electrode portion has a width that is larger than the first width of the first portion.

12. The solar cell of claim 11, wherein, when viewed in a plan view, the first electrode portion extends along a first direction, and the second electrode portion extends along a second direction crossing the first direction.

13. The solar cell of claim 11, wherein the second electrode is spaced apart from the second electrode portion on the second surface of the semiconductor substrate.

* * * * *